(12) United States Patent
Abeles

(10) Patent No.: US 6,445,724 B2
(45) Date of Patent: Sep. 3, 2002

(54) MASTER OSCILLATOR VERTICAL EMISSION LASER

(75) Inventor: Joseph H. Abeles, Highland Park, NJ (US)

(73) Assignee: Sarnoff Corporation, Princeton, NJ (US)

( * ) Notice: Subject to any disclaimer, the term of this patent is extended or adjusted under 35 U.S.C. 154(b) by 10 days.

(21) Appl. No.: 09/788,713

(22) Filed: Feb. 20, 2001

Related U.S. Application Data

(60) Provisional application No. 60/184,334, filed on Feb. 23, 2000.

(51) Int. Cl.[7] ............................. H01S 5/00; H01S 3/08
(52) U.S. Cl. ........................................ 372/50; 372/96
(58) Field of Search ............................. 372/50, 96, 75

(56) References Cited

U.S. PATENT DOCUMENTS

| | | | | |
|---|---|---|---|---|
| 5,003,550 A | * | 3/1991 | Welch et al. | 372/50 |
| 5,103,456 A | * | 4/1992 | Scifres et al. | 372/50 |
| 5,513,204 A | * | 4/1996 | Jayaraman | 372/96 |

* cited by examiner

*Primary Examiner*—Quyen Leung
(74) *Attorney, Agent, or Firm*—William J. Burke

(57) ABSTRACT

A master oscillator, vertical emission (MOVE) laser includes an oscillator, a coupling region, and vertical-cavity amplifier region formed on a common substrate. The coupling region may include separately defined expansion and grating regions. Single-mode radiation of the oscillator passes through the expansion region, which is a passive region that provides spatial expansion of the propagating single-mode radiation wavefront with little or no gain. The expanded single-mode radiation from the expansion region passes through the grating region, which provides coupling of the relatively broad wavefront from the expansion region into the cavity of the vertical-cavity amplifier. The expansion and grating regions may be configured to reduce or eliminate reflection of single-mode radiation propagating within the vertical-cavity amplifier back toward the oscillator. The cavity of the vertical-cavity amplifier is relatively broad when compared to the cavity of the oscillator. The vertical-cavity amplifier operates as a low-gain-per-pass amplifier for incident single- mode radiation generated by the oscillator. Thus, radiation of relatively low optical power emitted from the oscillator controls single-mode radiation of relatively high optical power emitted by the vertical-cavity amplifier.

15 Claims, 3 Drawing Sheets

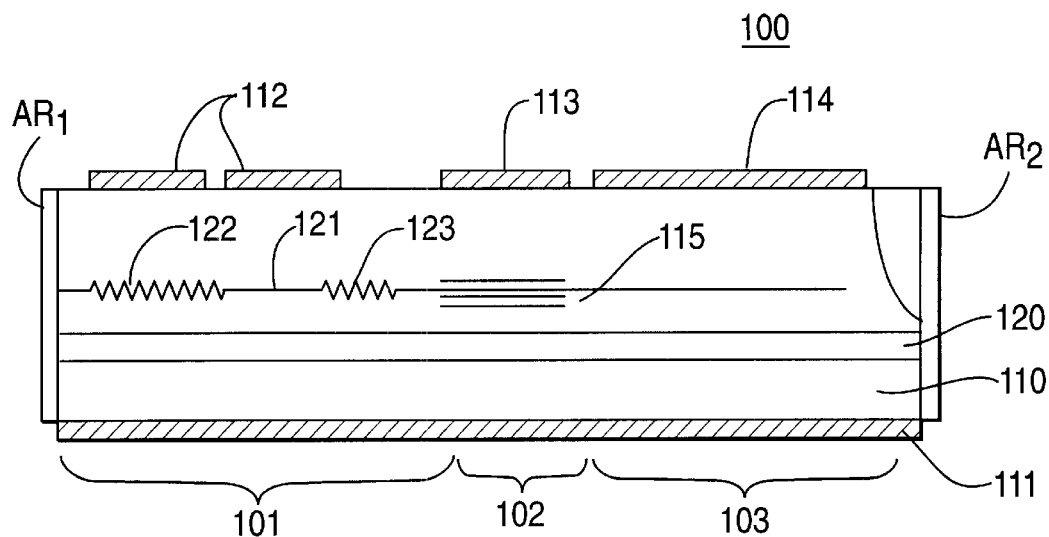
FIG. 1
PRIOR ART
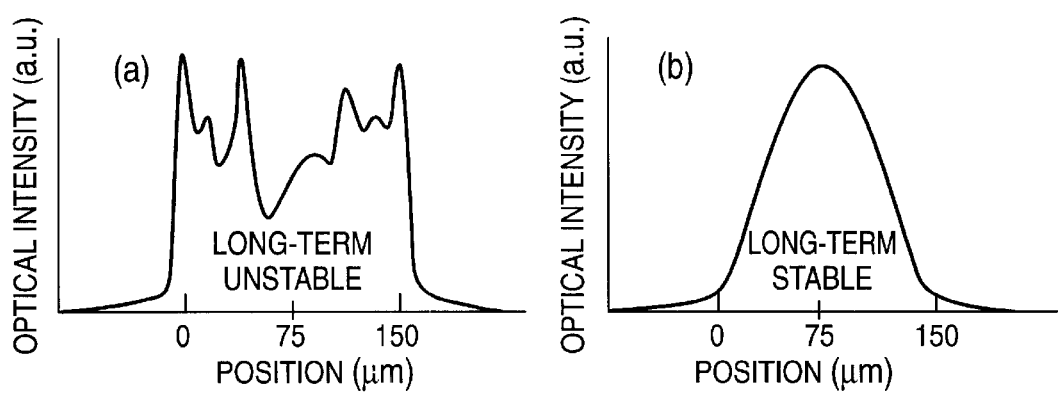
FIG. 2a
PRIOR ART
FIG. 2b
PRIOR ART

MASTER OSCILLATOR VERTICAL EMISSION LASER

Related Applications

This application claims the benefit of the filing date of U.S. provisional application No. 60/184,334, filed on Feb. 23, 2000,

BACKGROUND OF THE INVENTION

1. Field of the Invention

The present invention relates to integrated semiconductor lasers.

2. Description of the Related Art

High-power, single-mode laser diode sources are employed in a wide variety of applications, such as medical sensing devices and high-speed, optical telecommunication network components. For example, Raman amplifier components for optical networks typically require pump powers of 1 Watt and above.

A variety of laser diode structures exist in the prior art, including edge-emitting stripe, tapered stripe, broad stripe, grating-surface-emitting, master oscillator power amplifier, grating-stabilized broad stripe, surface-emitting distributed feedback, and antiguided array structures. Important features of any given laser diode structure include: high output power, single near-Gaussian spatial mode, short- and long-term lasing mode stability over time, long-term reliability, compact packaging, manufacturability, and ease of coupling to an external waveguide such as an optical fiber. However, no single laser diode structure of the prior art adequately possesses all of these features.

Obtaining relatively high output power with single-mode emission by a laser diode is difficult. Structures having greater output power tend to produce either (a) multi-mode emission or (b) low long-term stability and reliability. For example, linear stripe lasers, typically including either buried heterostructure or ridge waveguide lateral index guiding, have attained emitted powers of up to 700 mW in reports dating to 1992. However, these devices typically suffer from a high optical power density of 10–20 MW/cm$^2$ at the diode's output facet, which tends to degrade performance.

Some high-power, semiconductor laser diodes utilize a device structure with a light source (termed "master oscillator") and other components, all integrated onto a common semiconductor substrate. For example, a master oscillator power amplifier (MOPA) laser includes an oscillator and a high-gain optical amplifier that are monolithically integrated.

FIG. 1 shows an exemplary structure for a tapered-amplifier MOPA laser 100 of the prior art. MOPA laser 100 comprises single-mode laser diode oscillator 101, optional pre-amplifier 102, and optical power amplifier 103 that are formed on a common substrate 110. Single-mode laser diode oscillator 101 includes active region 120 and a gain region 121 that, along with the adjacent layers above and below them, form a transverse waveguide (i.e., a waveguide with direction parallel to the plane of the active region 120). However formed, MOPA laser 100 includes a light emitting region (e.g., active region 120) near a p-n-junction. Pump current applied to electrodes 111 and 112 greater than the lasing threshold current causes lasing (i.e., generation of amplified lightwaves) in active region 120 and gain region 121. MOPA laser 100 includes facets AR$_1$ and AR$_2$ that have anti-reflective coatings to minimize residual reflection of lightwaves within MOPA laser 100.

If a distributed Bragg reflector (DBR) laser is employed for the single-mode laser diode oscillator 101, gain region 121 is bounded by first- and second-order gratings 122 and 123. Gain region 121 may be formed by a lateral real refractive index waveguide material structure. Optional pre-amplifier 102 may be employed to optimize signal level and adjust beam shape of the lightwave produced by single-mode laser diode oscillator 101 that is subsequently applied to the following optical power amplifier 103. Pre-amplifier 102 typically includes a single-mode waveguide region that may be tapered. The single-mode waveguide region is formed from layers 115 adjacent to the active region 120, may be electrically isolated from single-mode laser diode oscillator 101, and is energized with pump current applied to electrodes 111 and 113.

Optical power amplifier 103 is coupled to pre-amplifier 102. Optical power amplifier 103 generally includes a transverse waveguide region about active region 120. In the transverse waveguide region, active region 120 is sandwiched between adjacent higher-bandgap, lower-refractive-index layers. Optical power amplifier 103 is electrically isolated from optical preamplifier 102 and is energized with pump current applied to electrodes 111 and 114.

A drawback of the MOPA laser structure of FIG. 1 is that the amplification of the beam emitted from the oscillator occurs when the beam passes through a relatively high-gain amplifier (e.g., optical power amplifier 103). The high-gain amplifier may have a typical single-pass gain in the neighborhood of 15 to 30 dB. In contrast, in solid-state lasing media supporting large, high-power optical modes (e.g., Nd:YAG rod external cavity lasers), the single-pass gain is relatively low (e.g., on the order of 0.1 dB per pass).

In a high-gain amplifier, a semiconductor region that supports multiple, propagating optical modes exhibits non-linearities associated with the optical amplification process. The non-linearities of the amplification process result from saturation of gain and cause beam distortions, including both those known as "self-focusing" which is related to the phenomenon known as "filamentation" that tends to distort the wavefront of the propagating radiation in an uncontrolled fashion. Self-focusing and filamentation arise in large part and are related to the Kramers-Kronig relationship between imaginary and real parts of the refractive index in the amplifier regions of the semiconductor. Self-focusing exists in many semiconductor laser structures, and is particularly pronounced in those structures that support more than one waveguide mode under pumped-cavity conditions. Unstable resonator lasers and surface-emitting, distributed-feedback lasers similarly exhibit distortion from self-focusing.

FIG. 2a illustrates the broad-area gain section optical intensity profile for a high-gain, high non-linearity gain section affected by self-focusing and filamentation. As shown in FIG. 2a, a plot of optical intensity versus wavelength position indicates that the wavefront exhibits an irregular shape about the center position 75 μm, and is thus long-term unstable. FIG. 2b illustrates the broad-area gain section optical intensity profile for a low-gain, low non-linearity gain section not affected by self-focusing. As shown in FIG. 2b, a plot of optical intensity versus wavelength position indicates that the wavefront exhibits a smooth roll-off shape about the center position 75 μm, and is thus long-term stable.

Most laser diodes are edge emitting and are so called because the light beam emits from the cleaved edge of the processed laser diode semiconductor chip (e.g., through facet $AR_2$ of FIG. 1). These types of laser diodes are commonly termed Fabry-Perot (FP) laser diodes since the laser diode cavity is similar to that of a conventional gas or solid state laser, but the cavity is formed inside the semiconductor laser diode chip itself. Mirrors may be formed by the cleaved edges of the chip, or one or both of the cleaved edges may be anti-reflection (AR) coated and external mirrors are added.

A vertical-cavity, surface-emitting laser (VCSEL), on the other hand, emits its beam from the top surface, and potentially the bottom surface, of the semiconductor chip. The cavity comprises a hundred or more layers of mirrors and active regions formed epitaxially on a bulk (inactive) substrate.

VCSEL devices exhibit the characteristics of low threshold current and low power when compared to other semiconductor laser diode devices that emit single-mode radiation. Lower lasing threshold and drive current results in lower electrical power requirements, potentially faster modulation, simpler drive circuitry, and reduced radio frequency interference (RFI) emission. VCSEL devices are also more tolerant of fluctuations in power supply drive. Directly controlling current for continuous operation is generally sufficient without requiring an optical feedback path, such as a feedback signal generated from a monitor photodiode mounted near one of the facets.

Although VCSEL devices that exhibit higher power are known in the prior art, these devices emit multi-mode radiation. In general, the broad cavity structure of VCSEL devices does not contain an alignment mechanism for lightwaves propagating through the cavity to produce single-mode radiation. VCSEL devices operated under external cavity, optically pumped conditions may provide higher power while maintaining single-mode emission, but these devices are relatively complex and require unwieldy external optical elements to support the single-mode emission. Such external components generally comprise specially designed mirrors to provide the necessary alignment mechanism.

SUMMARY OF THE INVENTION

The present invention relates to a master oscillator, vertical emission (MOVE) laser including an oscillator, coupling region, and vertical cavity amplifier region formed on a common substrate. The coupling region may include separately defined expansion and grating regions. The emitted single-mode radiation of the oscillator passes through the expansion region, which is a substantially passive region that provides spatial expansion of the propagating single-mode radiation wavefront with little or no gain. The expanded single-mode radiation from the expansion region passes through the grating region, which provides coupling of the relatively broad wavefront into the cavity of the vertical-cavity amplifier from the expansion region. The expansion and grating regions may be configured to reduce or eliminate reflection back toward the oscillator of single-mode radiation propagating within the vertical-cavity amplifier. The cavity of the vertical-cavity amplifier is relatively broad in cross-sectional area and relatively short in length when compared to the cavity of the oscillator. The vertical-cavity amplifier operates as a low-gain-per-pass amplifier for incident single-spatial-mode radiation generated by the oscillator. Thus, radiation of relatively low optical power emitted from the oscillator controls single-mode radiation of relatively high optical power emitted by the vertical-cavity amplifier.

In accordance with an exemplary embodiment of the present invention, an integrated semiconductor laser includes an oscillator having a cavity and capable of generating single-mode radiation; a vertical-cavity amplifier having a cavity broader than the oscillator cavity; and a coupling region having a narrow end coupled to the oscillator cavity and a wide end coupled to the vertical-cavity amplifier. When operating, single-mode radiation received from the oscillator is expanded by the coupling region and coupled into the vertical-cavity amplifier, and the vertical-cavity amplifier emits single-mode radiation at an optical power greater than that of the single-mode radiation generated by the oscillator.

BRIEF DESCRIPTION OF THE DRAWINGS

Other aspects, features, and advantages of the present invention will become more fully apparent from the following detailed description, the appended claims, and the accompanying drawings in which:

FIG. 1 shows an exemplary master oscillator, power amplifier (MOPA) structure of the prior art;

FIG. 2a illustrates the broad-area gain section optical intensity profile for a high-gain, high non-linearity gain section affected by self-focusing and filamentation;

FIG. 2b illustrates the broad-area gain section optical intensity profile for a low-gain, low non-linearity gain section not affected by self-focusing;

DETAILED DESCRIPTION

Figure 3:
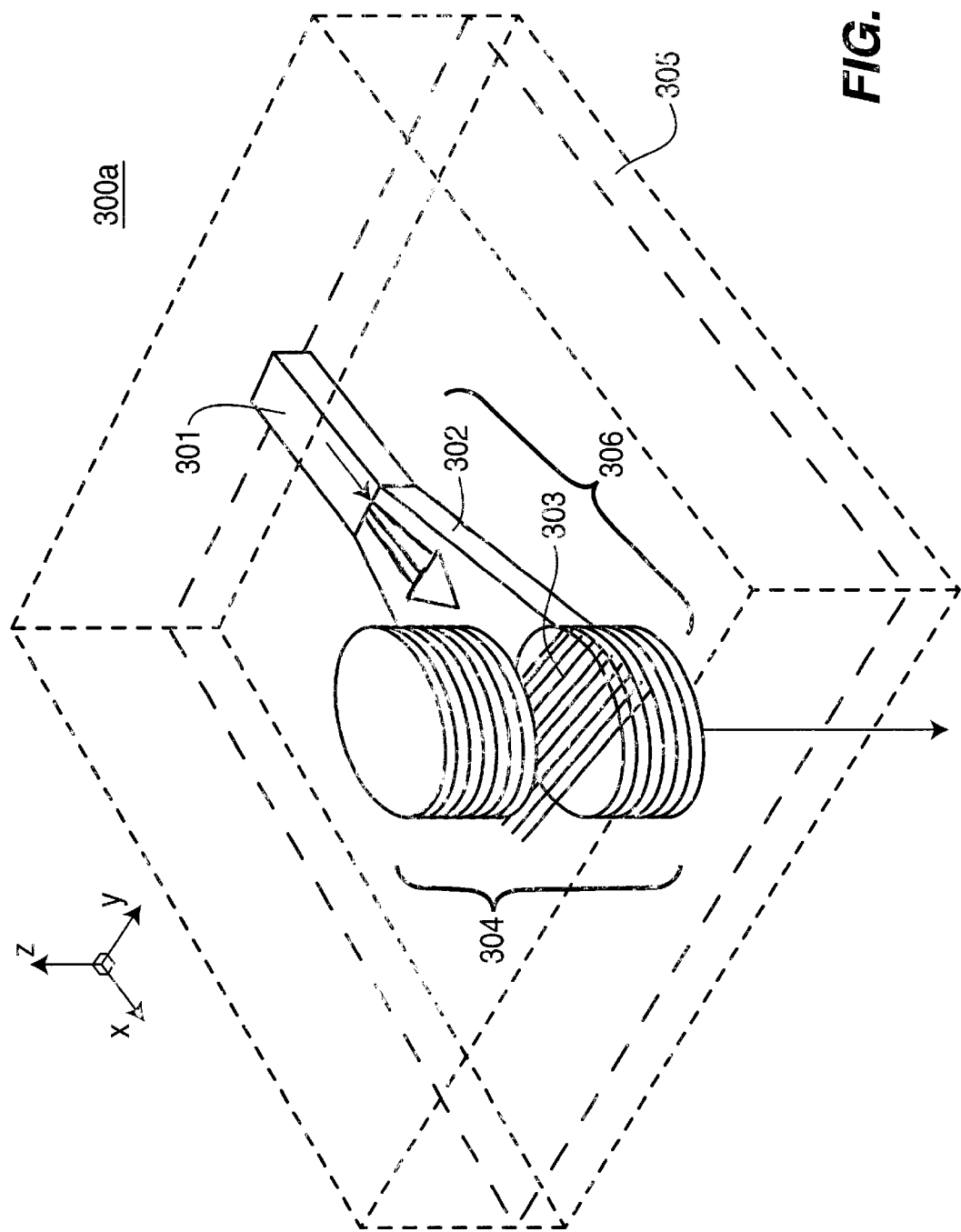
FIG. 3 shows relative positioning of elements for a master oscillator, vertical emission, (MOVE) laser diode in accordance with embodiments of the present invention.
Figure 4:
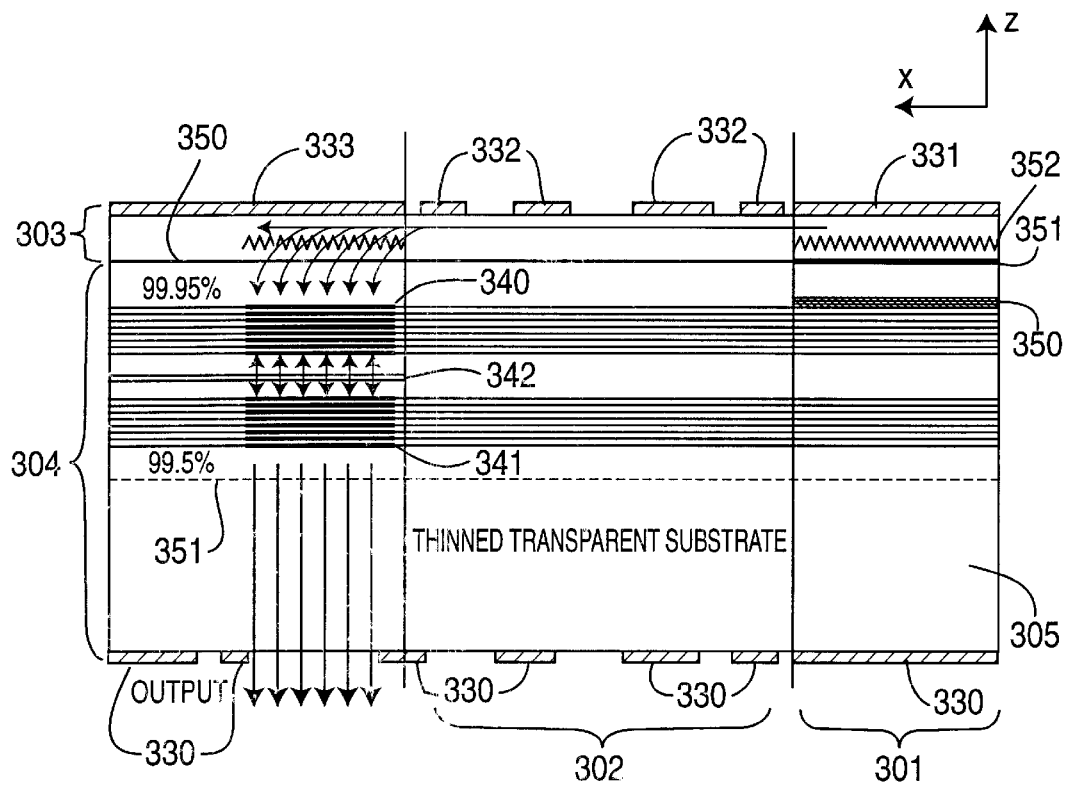
FIG. 4 shows a cross-sectional view of a MOVE laser diode in accordance with an embodiment of the present invention.
Figure 5:
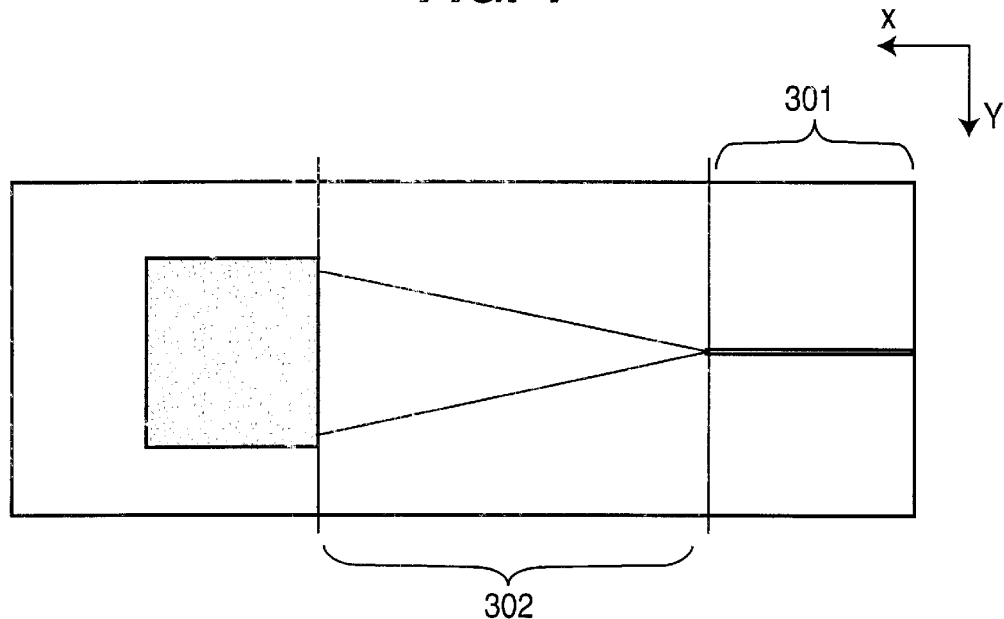
FIG. 5 shows a top view of the MOVE laser diode of FIG. 4.

Referring to FIGS. 3, 4, and 5, there is shown a master oscillator, vertical emission (MOVE) laser in accordance with an embodiment of the present invention. MOVE laser 300 includes oscillator 301, coupling region 306, and vertical cavity amplifier 304 all formed on a common substrate 305. Grating region 303 may be positioned either within vertical-cavity amplifier 304 (as shown in FIG. 3), or above or below the vertical-cavity amplifier 304 (as shown in FIG. 4). FIG. 3 shows relative positioning of elements for MOVE laser 300a. Single-spatial-mode radiation propagates from oscillator 301 to vertical cavity amplifier 304 through coupling region 306 comprising expansion region 302 and grating region 303. As used herein, the terms "single-spatial-mode" and "single-mode" are used interchangeably to refer to single-spatial-mode radiation as lightwaves propagating within the elements of MOVE laser.

In accordance with embodiments of the present invention, oscillator 301 provides single-mode radiation of relatively low power from its cavity over a relatively small (facet) surface area. Coupling region 306 expands the single-mode radiation spatially with little or no gain, thereby providing radiation with a relatively broad wavefront while avoiding effects that tend to cause self-focusing. Coupling region 306 further reflects the broad wavefront radiation into the cavity of the vertical-cavity amplifier, while mitigating reflection of radiation back toward oscillator 301. Vertical-cavity amplifier 304 operates as a low-gain-per-pass amplifier for incident single-spatial-mode radiation from oscillator 301, thereby further avoiding effects that tend to cause self-focusing. Vertical-cavity amplifier 304 provides single-mode output power over a relatively broad area, thus acting as an optical power amplifier.

FIGS. 4 and 5 show cross-sectional and top views, respectively, of MOVE laser 300b in accordance with an exemplary embodiment of the present invention having common electrode 330 formed on the bottom of substrate 305, and electrodes 331, 332, and 333 formed on the top of MOVE laser 300b. MOVE laser 300b may be formed either as a homostructure, single/double heterostructure, or multiple heterostructure. Material composition for MOVE laser 300b is typically a combination of Group m-V compound semiconductors. Substrate 305 is made of any suitable semiconductor material, and preferred embodiments of the present invention employ GaAs to facilitate epitaxial growth of subsequent GaAs compound layers and their derivatives. Epitaxial growth may be by any suitable technique, such as metal organic chemical vapor deposition, molecular beam epitaxy, or chemical beam epitaxy. As would be apparent to one skilled in the art, other common semiconductor materials may be employed, such as Ge, Si, InAs, inP, and GaSb.

Oscillator 301 is a laser diode emitting single-mode radiation at a single frequency, and the laser diode is employed as a source of single-mode, coherent optical power for subsequent amplification. The frequency of the single-mode radiation is tailored to the characteristics of vertical-cavity amplifier 304, and the optical power of the radiation emitted by oscillator 301 is set to optimize injection of coherent power into vertical-cavity amplifier 304. The cavity of oscillator 301 is relatively narrow when compared to the cavity width of vertical-cavity amplifier 304. For example, the oscillator cavity would be approximately 3 microns in width, whereas the vertical-cavity amplifier would be between 25 and 500 microns in diameter.

Oscillator 301 may be embodied as a distributed-feedback Bragg reflector (DFBR) laser diode. In general, any number of different laser diode structures may be employed for oscillator 301 that may be integrated into a semiconductor substrate to provide a source of single-mode, coherent optical power. Other types of laser diode structures include: edge-emitting stripe, tapered stripe, broad stripe, grating-surface-emitting, grating-stabilized broad stripe, and surface-emitting distributed feedback structures. In general, oscillator 301 includes light-emitting active and gain regions near a pn-junction and within a transverse waveguide 351. The active region may be formed in any number of ways known in the art, such as by disposing layers of ternary or quasi-ternary compounds (e.g., AlGaAs, inGaAs, InGaAs (Sb)) with one or more quantum wells bounded by barrier regions. Pump current applied to electrodes 330 and 331 greater than the lasing threshold current causes oscillator 301 to generate a single-spatial-mode radiation. The transverse waveguide is coupled to a grating 352 that has a reflection response that peaks at the frequency of the lightwave in the waveguide region. The output single-mode radiation from the grating is directed to expansion region 302. An optional isolation layer 350 may be employed to isolate the oscillator 301 from the remaining layers of the integrated semiconductor during formation of expansion region 302 and vertical-cavity amplifier 304.

Expansion region 302 is a passive, low-gain mode expansion region coupling oscillator 301 to grating region 303. Expansion region 302 is substantially isolated electrically from oscillator 301, grating region 303, and vertical-cavity amplifier 304. Little or no net gain is provided to the optical signal passing through expansion region 302, which behaves as an optical waveguide for the propagating lightwave. A split contact 332 is formed on top of expansion region 302. Current may be injected between electrodes 330 and 332 in a manner sufficient to cause the material of expansion region 302 to be optically transparent to the propagating radiation. The current may be pump current and the expansion region may be formed with an active region if slight gain is required to offset optical signal losses within the material as the lightwave propagates through it.

As the radiation passes through expansion region 302 toward grating region 303, the radiation wavefront is expanded laterally as it passes to grating region 303. Here, "lateral" refers to the direction in the plane of the active region of oscillator 301 perpendicular to the direction of propagation of lightwaves, and perpendicular to the vertical direction (e.g., along the y axis of FIGS. 3, 4, and 5). The direction of emitted radiation (emitted lightwave) propagating from oscillator 301 is referred to herein as the longitudinal direction (e.g., along the x axis of FIGS. 3, 4, and 5). Light is emitted from MOVE laser 300a. and 300b in the vertical direction, shown in FIGS. 3, 4, and 5 as the axis perpendicular to the top and bottom of MOVE laser 300a. and 300b (e.g., along the z axis of FIGS. 3, 4, and 5).

Expansion region 302 operates in similar manner to a pre-amplifier region of a tapered master oscillator, power amplifier (MOPA) of the prior art, but differs in that preferably little or no net gain is provided as the single-mode radiation wavefront expands. When the expanded mode wavefront reaches the vertical-cavity structure, it has expanded to a lateral width significantly wider than that of the output radiation from oscillator 301. Without significant gain or loss in expansion region 302,-the single-mode radiation beam enlarges laterally in a manner that is free from distortion due to non-linearities and other self-focusing effects that may result from gain. Thus, the width at the beginning of expansion region 302 (i.e., the side coupled to oscillator 301) is similar to the width of the oscillator waveguide, while the end of expansion region 302 (i.e., the side coupled to grating region 303) is significantly wider than the width of the oscillator waveguide. The width may also be significantly wider than that of a single-mode vertical-cavity laser. Consequently, the width at the larger end may be as small as 10 $\mu$m, or up to 250 $\mu$m or more. The typical width of the narrow end is 3 microns.

Reflected radiation that passes through expansion region 302 toward oscillator 301 is substantially attenuated as it propagates in the direction opposite to lateral expansion. Thus, expansion region 302 acts as a spatial, optical filter to reduce or eliminate incident radiation to oscillator 301.

The expansion region 302 and grating region 303 are configured so as to provide radiation from oscillator 301 either perpendicularly (along z axis) to or at a tilted angle (within x-z plane) into vertical-cavity amplifier 303. Grating region 303 may be positioned either within vertical-cavity amplifier 303 (as shown in FIG. 3) near a, or above or below the stacks of Bragg reflectors 340 and 341 at a port of vertical-cavity amplifier 304 (as shown in FIG. 4).

Grating region 303 may be formed between two adjacent semiconductor layers having different indices of refraction. Grating region 303 is formed so that, when MOVE laser 300 is operating, a lightwave in grating region 303 may interact with a lightwave propagating in layers of vertical-cavity amplifier 304. For coupling, the degree of optical lightwave overlap depends on the reflectivity of the grating structure. In general, forming grating region 303 with more teeth and/or deeper teeth results in a greater reflectivity. In addition, spacing between the teeth and the pitch of the spacing tends to effect reflectivity. Preferred embodiments may involve a second order grating structure for grating region 303 that is periodic, satisfies the well-known Bragg condition, and has a reflection response that peaks at the frequency of the lightwave emitted by oscillator 301. Since grating region 303 has an out-coupling and reflection response tailored to coupling radiation from expansion region 302 to vertical-cavity amplifier 304, grating region 303 tends not to pass reflected radiation back from vertical-cavity amplifier 304 to expansion region 302.

Vertical-cavity amplifier 304 is formed of at least two stacks of Bragg reflectors 340 and 341 disposed about an active region 342. Active region 342 may be formed in a number of ways known in the art, and for the preferred embodiment may comprise one or more quantum wells bounded by barrier regions adjacent to corresponding Bragg reflectors 340 and 341. For a preferred embodiment, vertical-cavity amplifier 304 may generally be made of layers of AlGaAs. Each stack of Bragg reflectors 340 and 341 comprises multiple, high-reflectivity dielectric mirror layers formed by alternating the relative concentration of compound elements in each layer of the stack. Various techniques are known in the art for forming the multiple, high-reflectivity dielectric mirror layers in Bragg reflectors 340 and 341. In addition, one of the stacks of Bragg reflectors 340 and 341 is generally doped with a p-type dopant, while the other stack is generally doped with an n-type dopant. Vertical-cavity amplifier 304 operates as a low-gain-per-pass amplifier because of a relatively short propagation distance between mirrors, which may be approximately 2 μm in the described embodiment.

Electrode 333 is formed on the top of vertical-cavity amplifier 304, and portions of electrode 330 are formed under a corresponding area of substrate 305 on the bottom of vertical-cavity amplifier 304. In order to allow light to pass through the bottom of MOVE laser 300b, this area of substrate 305 is preferably a thinned, optically transparent substrate. In addition, portions of electrode 330 that are formed on this area of substrate 305 allow for emission of single-mode output optical power through the bottom of MOVE laser 300b using techniques known in the art. These techniques may include depositing the electrode material onto substrate 305 and then photo-etching areas, and/or depositing thinned, optically transparent conductor material between the portions of electrode 330 and substrate 305. Vertical-cavity amplifier 304 is formed such that current injected or pumped into vertical-cavity amplifier 304 preferably does not flow through stacks of Bragg reflectors 340 and 341. Current flowing through stacks of Bragg reflectors 340 and 341 may generate heat, material dislocation, or other degradation because of electrical impedance of each stack. Vertical-cavity amplifier 304 is substantially isolated electrically from grating region 303, expansion region 302, and oscillator 301.

Vertical-cavity amplifier 304 operates in a manner similar to that of vertical-cavity surface-emitting lasers (VCSEL) of the prior art. Pump current applied to electrodes 330 and 333 greater than the lasing threshold current causes lasing within the cavity. A broad-cavity VCSEL generally emits radiation having multi-spatial-mode beams. However, in accordance with embodiments of the present invention, injecting a lightwave of single-spatial-mode radiation causes single-mode emission from the broad-area cavity of vertical-cavity amplifier 304. Thus, vertical-cavity amplifier 304 tends to operate as a regenerative amplifier, in sharp contrast to behavior of an in-plane optical gain amplifier as used in MOPA lasers of the prior art (e.g., MOPA laser 100 of FIG. 1).

In an integrated semiconductor laser, the master oscillator (e.g., oscillator 301) may become destabilized due to feedback from the vertical-cavity power amplifier. When destabilized, the master oscillator may cease operation, or change from emitting a single- mode radiation to emitting multi-mode radiation. To reduce the possibility of destabilizing oscillator 301, preferred embodiments position the grating region 303 outside of (above or below in the vertical axis) the vertical-cavity amplifier 304, and on the opposite side from which power is extracted. As shown in FIG. 4, grating region 303 couples the radiation into the vertical-cavity amplifier at the base of stack 340, rather than between stacks as shown in FIG. 3. Single-mode optical radiation from grating region 303 impinges on the vertical-cavity amplifier through a port 350 having higher reflectivity than port 351. Port 351 is opposite to port 350 and is utilized for the output light beam, as shown in FIG. 4. This structure of FIG. 4, in addition to the spatial filtering of expansion region 302, attenuates or removes reflected radiation that may propagate in the feedback path back to oscillator 301.

For the preferred embodiment of FIG. 4, the stack of Bragg reflectors 340 has a reflectivity (in the absence of operation under the Fabry-Perot cavity and amplification) of about 99.95% at port 350, while the stack of Bragg reflectors 341 has a reflectivity under the same conditions of about 99.5% at port 351. Thus, significantly more optical power is emitted through the bottom at port 351 when operating than from the top port 350 of the structure. Under bias, however, the cavity of the vertical-cavity amplifier 304 becomes significantly more transparent at resonance due to the Fabry-Perot effect, which effect is further enhanced by the presence of optical gain in the cavity. Thus, a relatively small level of optical power injected into the cavity from the master oscillator controls a relatively large level of optical power emitted by the vertical-cavity amplifier in a manner similar to that of the well-known injection-locking effect.

In comparison to in-plane optical amplifiers such as those used in the prior art, non-linearities are sharply reduced in a vertical optical amplifier because of the low gain of the vertical cavity medium per pass. The gain of each quantum well is quite low, but the gain need only offset slightly the loss caused by the cavity/reflector media for each pass. The real part of the refractive index of the vertical-cavity medium is generally uniform across the medium in two-dimensions. The real part of the refractive index of the vertical-cavity medium is highly uniform because the losses of the vertical cavity medium are quite small and, therefore, may be overcome with low-gain quantum wells within the vertical cavity.

The embodiments shown and described with respect to FIGS. 3 and 4 may be preferred because of manufacturing or other specific implementation concerns. However, the present invention is not so limited. Embedding oscillator 331 closer to the substrate, placing grating region below port 351, and reversing the relative reflectivity of the stacks of Bragg reflectors 340 and 341 may form a MOVE laser having its output light beam through the top of the laser. Such structure may allow for reduced optical power loss and better output coupling of the lightwave by avoiding a relatively long path through the semiconductor substrate. In addition, one skilled in the art would realize that the present invention may be extended to other types of vertical-cavity amplifier structures. For example, a vertical-cavity amplifier with only one stack of Bragg reflectors may be formed and coupled to grating region, possibly having a mirror in between the grating region and stack.

Thus, there is provided an integrated master oscillator, vertical emission laser in accordance with embodiments of the present invention. It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a semiconductor laser comprising:

an oscillator having a cavity and capable of generating single-mode radiation;

a vertical-cavity amplifier having a cavity broader than the oscillator cavity; and a coupling region having a narrow end coupled to the oscillator cavity and a wide end coupled to the vertical-cavity amplifier, wherein:

when operating, single-mode radiation received from the oscillator is expanded by the coupling region and coupled into the vertical-cavity amplifier, and the vertical-cavity amplifier emits single-mode radiation at an optical power greater than that of the single-mode radiation generated by the oscillator.

2. The invention of claim 1, wherein the coupling region comprises an expansion region and a grating region.

3. The invention of claim 2, wherein the expansion region allows for lateral spatial expansion of the single-mode radiation between the oscillator and the grating region.

4. The invention of claim 3, wherein:

the oscillator, grating region, and vertical-cavity amplifier are formed from a plurality of layers, a material for the common semiconductor substrate is selected from the group consisting of germanium, silicon, gallium arsenide, indium arsenide, indium phosphide, and gallium antimodide, and the plurality of layers comprises materials selected from Group III-V compounds based on the material selected for the substrate.

5. The invention of claim 2, wherein the grating region couples the single-mode radiation from the oscillator to the vertical-cavity amplifier.

6. The invention of claim 1, wherein the oscillator is a laser diode.

7. The invention of claim 6, wherein a structure for the laser diode is either edge-emitting stripe, tapered stripe, broad stripe, grating-surface-emitting, grating-stabilized broad stripe, or surface-emitting distributed feedback.

8. The invention of claim 1, wherein the cavity of the vertical cavity amplifier is formed from at least two stacks of reflectors formed about an active region.

9. The invention of claim 8, wherein each stack comprises multiple, high-reflectivity dielectric mirror layers.

10. The invention of claim 9, wherein each stack comprises a plurality of Bragg reflectors.

11. The invention of claim 8, wherein the cavity of the vertical cavity amplifier includes a port at each opposing end of the vertical-cavity amplifier.

12. The invention of claim 11, wherein a grating region is positioned between each of the two stacks of reflectors.

13. The invention of claim 11, wherein:

one of the two stacks has less reflectivity than the other stack, and the coupling region is positioned) adjacent to the port adjacent to the stack having higher reflectivity, and the cavity emits the single-mode light beam from the port at the other end of the vertical cavity amplifier.

14. The invention of claim 1, wherein the oscillator, grating region, and vertical-cavity amplifier are integrated on a common semiconductor substrate.

15. The invention of claim 1, wherein the vertical-cavity amplifier exhibits a low-gain-per-pass characteristic.

* * * * *